United States Patent
Suh et al.

(10) Patent No.: US 7,371,674 B2
(45) Date of Patent: May 13, 2008

(54) NANOSTRUCTURE-BASED PACKAGE INTERCONNECT

(75) Inventors: Daewoong Suh, Phoenix, AZ (US); Nachiket R. Raravikar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 11/315,532

(22) Filed: Dec. 22, 2005

(65) Prior Publication Data

US 2007/0148949 A1    Jun. 28, 2007

(51) Int. Cl.
*H01L 21/44* (2006.01)
(52) U.S. Cl. ......... 438/612; 257/E51.04; 257/E21.287; 257/E21.291; 977/700; 977/712; 977/762
(58) Field of Classification Search ................ 438/612
See application file for complete search history.

(56) References Cited

U.S. PATENT DOCUMENTS

| 6,185,961 | B1 | 2/2001 | Tonucci et al. |
| 2004/0233649 | A1 | 11/2004 | Honlein et al. |
| 2005/0224975 | A1* | 10/2005 | Basavanhally et al. ..... 257/741 |
| 2006/0037477 | A1* | 2/2006 | Lopez et al. .................... 96/11 |
| 2006/0270229 | A1* | 11/2006 | Corderman et al. ........ 438/689 |
| 2007/0020146 | A1* | 1/2007 | Young et al. ............. 422/82.01 |

FOREIGN PATENT DOCUMENTS

WO    WO 99/25652    5/1999

OTHER PUBLICATIONS

C. Durkan et al.., "Analysis of Failure Mechanisms in Electrically Stressed Au Nanowires", J. Applied Phys. vol. 86, No. 3 (1999), pp. 1280-1286.
R. Krishnan et al., "Wafer-Level Ordered Arrays of Aligned Carbon Nanotubes with Controlled Size and Spacing on Silicon", Nanotechnology, vol. 16, 841-845 (2005).
A.J. Yin et al., "Fabrication of Highly Ordered Metallic Nanowire Arrays by Electrodeposition", Appl. Phys. Lett., vol. 79, No. 7, 1039-1041 (2001).
R. -J. Lin et al., "Effect of Template Materials on the Top Morphologies of Cu Nanowires", Proceedings of the Materials Research Society, Warrnedale, PA, USA, 133-137 (2004).

* cited by examiner

*Primary Examiner*—Walter Lindsay, Jr.
*Assistant Examiner*—Abdulfattah Mustapha
(74) *Attorney, Agent, or Firm*—Blakely, Sokoloff, Taylor & Zafman LLP

(57) ABSTRACT

An embodiment of the present invention is an interconnect technique. A nanostructure bump is formed on a die. The nanostructure bump has a template defining nano-sized openings and metallic nano-wires extending from the nano-sized openings. The die is attached to a substrate via the nanostructure bump.

9 Claims, 7 Drawing Sheets

NANOSTRUCTURE-BASED PACKAGE INTERCONNECT

BACKGROUND

1. Field of the Invention

Embodiments of the invention relate to the field of nanotechnology, and more specifically, to nanotechnology in packaging.

2. Description of Related Art

Current first level interconnect technology involves metal, typically copper (Cu), bump formation on the silicon die and solder formation on the substrate side, using either stencil printing or electroplating. During chip attachment process, the solder reflows to form an electrical interconnect between the die and the substrate.

The existing interconnect technology has several problems or limitations. First, metals are susceptible to electro-migration, especially at high current densities. As the pitch and size of bumps become smaller for higher density interconnects, the current density carried by the metal bumps is also increasing. This leads to worsened electro-migration, posing serious reliability risks. Second, high density interconnects require decreased input/output (I/O) pitch and therefore bump size. Existing bump pitch for processor die is approximately 180 µm. It is extremely difficult to achieve nanometer-scale interconnect (e.g., in the order of 30 µm or less) using existing materials and processes partly because of the increased resistance and the electro-migration problem.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is an interconnect technique. A nanostructure bump is formed on a die. The nanostructure bump has a template defining nano-sized openings and metallic nano-wires extending from the nano-sized openings. The die is attached to a substrate via the nanostructure bump.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique for die-to-substrate interconnects. A metallic nanostructure is used as interconnect bump for fine pitch and high-current carrying applications. The nanostructure bump includes a template having nano-sized openings (e.g., pores or holes). The template may be an anodized aluminum oxide (AAO) template or a meso-porous polycarbonate membrane. Highly ordered metallic nano-wires of metal such as gold (Au), silver (Ag), or copper (Cu) may be vertically grown from the nano-sized openings on the AAO or polycarbonate template. The metallic nano-wires may serve as electrical and thermal conducting path. The metallic nano-wires exhibit high current-carrying capability. For example, Au nano-wire has current-carrying capability of up to $10^8$ A/cm$^2$ which is two orders of magnitude higher than that of conventional micron-sized Au. Due to small sizes, the nanostructure bump provides very fine pitches for high density interconnect applications. In addition, the high current-carrying capability of the nano-wires reduces electro-migration risks encountered at high current densities. The nanostructure-based package interconnect is suitable for ultra high power interconnect applications.

Figure 1A:
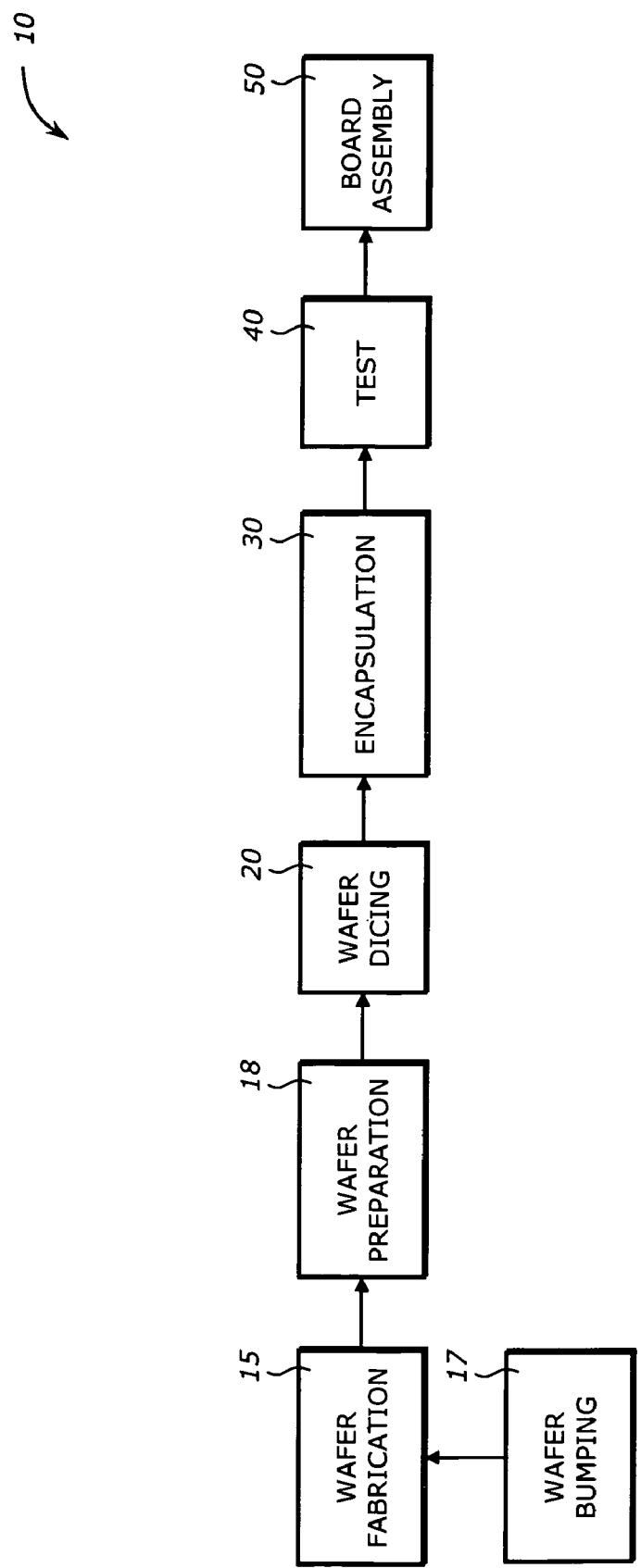
FIG. 1A is a diagram illustrating a manufacturing system in which one embodiment of the invention may be practiced.

FIG. 1A is a diagram illustrating a manufacturing system 10 in which one embodiment of the invention can be practiced. The system 10 includes a wafer fabrication phase 15, a wafer bumping phase 17, a wafer preparation phase 18, a wafer dicing phase 20, an encapsulation phase 30, a testing phase 40, and a board assembly phase 50. The system 10 represents a manufacturing flow of a semiconductor packaging process.

The wafer fabrication phase 15 fabricates the wafer containing a number of dice. The individual dice may be any microelectronic devices such as microprocessors, memory devices, interface circuits, etc. The wafer fabrication phase 15 includes typical processes for semiconductor fabrication such as preparation of the wafer surface, growth of silicon dioxide (SiO$_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or more recently copper. The various metal layers are interconnected by etching holes, called "vias," in the insulating material.

The wafer bumping phase 17 provides attachment bumps to the wafer for package interconnects. Nanostructure bumps with nano-wires are deposited, coated, or attached to the wafer. The bumping process may include evaporation, patterning, metal deposition, etching, etc. The nanostructure bumps are used for attaching the individual dice to the substrates in the encapsulation phase 30. This phase may be integrated with the wafer fabrication phase 15.

The wafer preparation phase 18 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 20 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The encapsulation phase 30 encapsulates the dice and the package substrates. The dice may be homogeneous or heterogeneous. The encapsulation includes printing the composite paste, placing the dice, flip-chip fluxing and placement, reflowing, or thermo-sonically bonding to bond the nanostructure bumps on the die to the metal pads on the substrate. Additional processing tasks may be performed including inspection, under-fill dispensing and curing, etc. Integrated heat spreader (IHS) may be attached to the die and substrate assembly. The encapsulated assembly of the dice and substrate becomes a package ready to be tested.

The testing phase 40 performs one or more tests on the package under various conditions. The test may be highly accelerated stress test (HAST) or biased-HAST. The package may be powered or non-powered. The testing phase 40 may be optional.

The board assembly phase 50 assembles the package into a printed circuit board. This phase attaches the device package to the board. This phase may include various soldering processes, reflow, testing, and inspection. The assembled board is then installed into a platform in a system or unit.

Figure 1B:
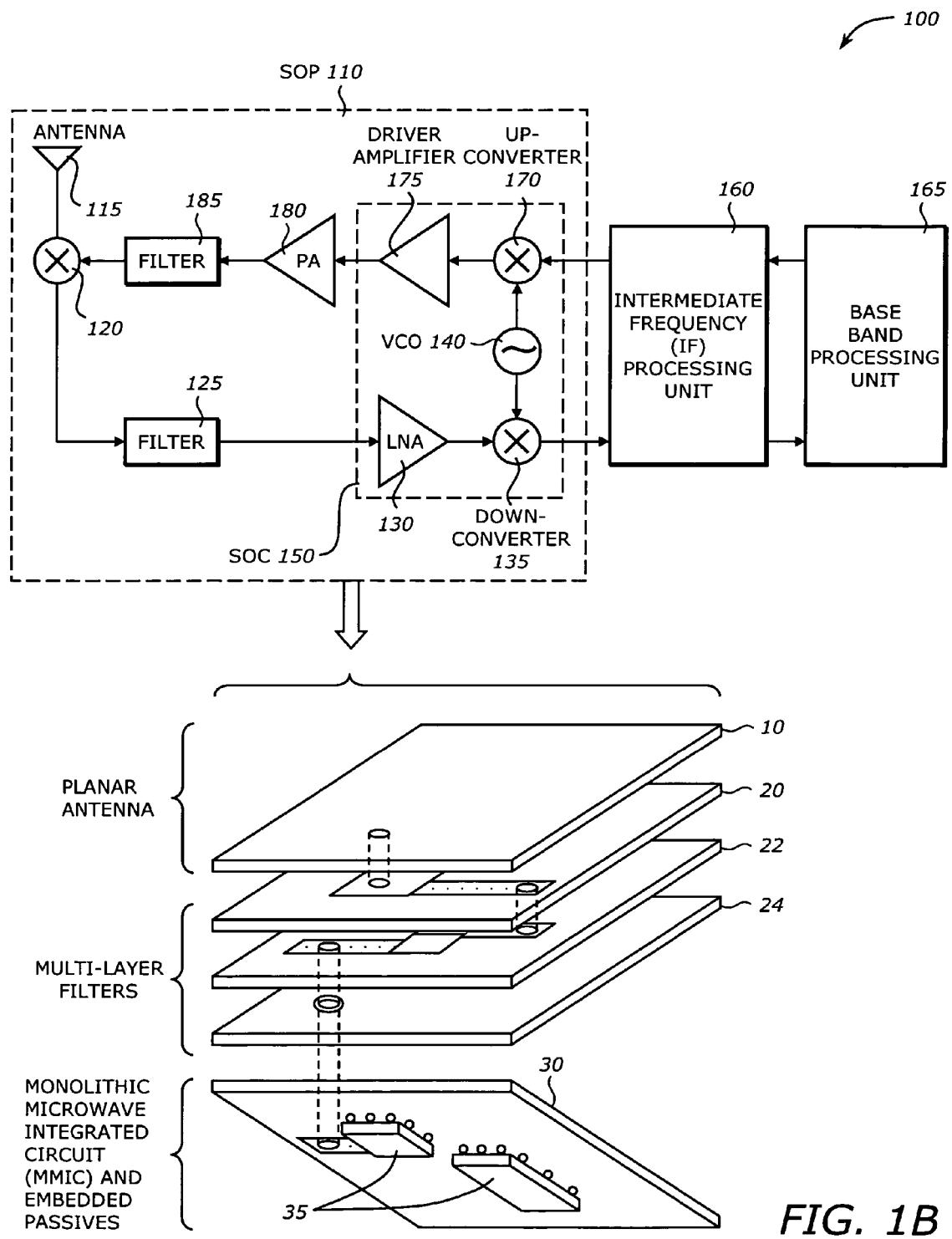
FIG. 1B is a diagram illustrating an application system 100 according to one embodiment of the invention

FIG. 1B is a diagram illustrating an application system 100 according to one embodiment of the invention. The system 100 represents a mobile communication module. It includes a system on package (SOP) 110, an intermediate frequency processing unit 160, and a base-band processing unit 165.

The SOP 110 represents the front end processing unit for the mobile communication module. It is a transceiver incorporating on-package integrated lumped passive components as well as RF components. It includes an antenna 115, a duplexer 120, a filter 125, a system-on-chip (SOC) 150, a power amplifier (PA) 180, and a filter 185.

The antenna 115 receives and transmits RF signals. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter at 5.8 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 170, and a driver amplifier 175. The LNA 130 amplifies the received signal. The down converter 135 is a mixer to convert the RF signal to the IF band to be processed by the IF processing unit 160. The up converter 170 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The base-band processing unit 165 may include analog-to-digital converter (ADC) and digital-to-analog converter (DAC) to convert analog signal to digital data and vice versa. It may include a digital processor with memory and peripheral components to process digital data.

The SOP 110 may be a multi-layer three-dimensional (3D) architecture for a monolithic microwave integrated circuit (MMIC) with EP technology. It may be implemented using Low Temperature Co-fired Ceramics (LTCC) and organic-based technologies. The 3D architecture may include multiple layers include a layer 10 to implement the planar antenna 115, layers 20, 22, and 24 for the filters 125 and 185, and layer 30 for the SOC 150, monolithic microwave integrated circuits (MMICs), and the passive components using EP technology. In particular, the MMICs include packaged devices 35 with metallic nanostructure as interconnect bumps.

Figure 2A:
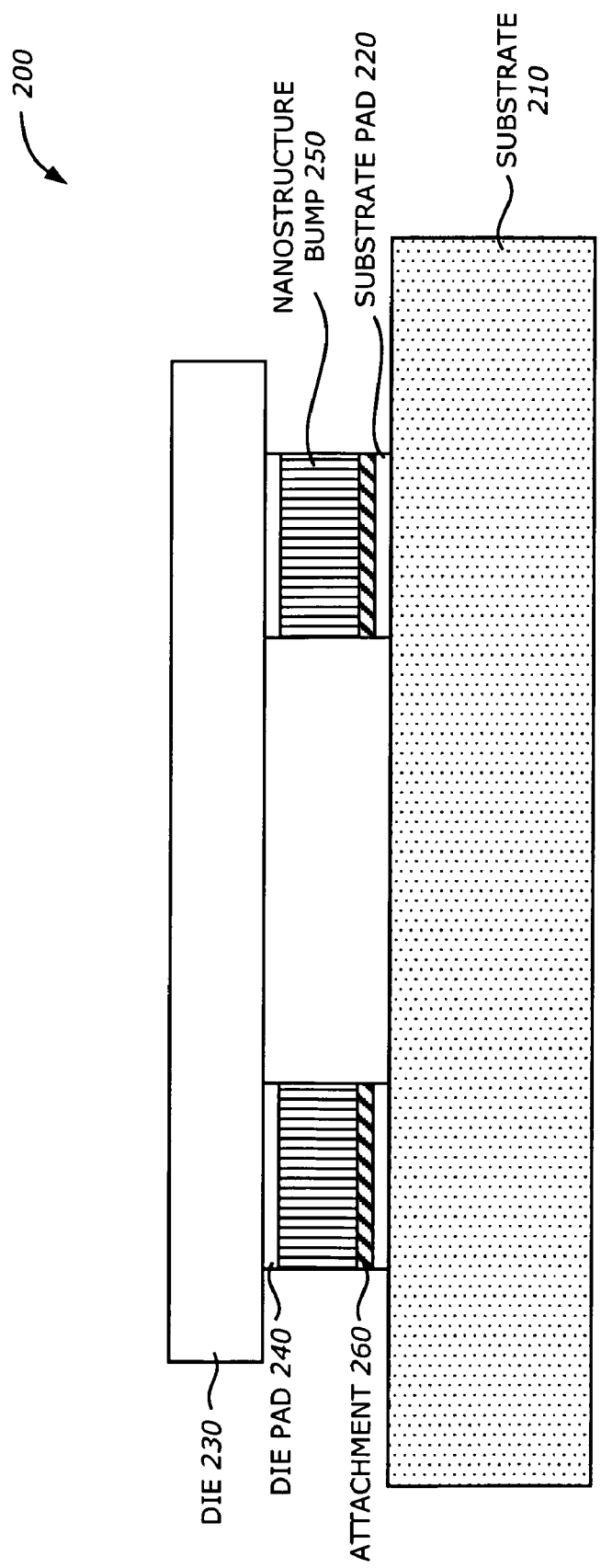
FIG. 2A is a diagram illustrating a package according to one embodiment of the invention.

FIG. 2A is a diagram illustrating a package 200 according to one embodiment of the invention. The package 200 represents a package completed in the encapsulation phase 130 shown in FIG. 1A or the packaged device 35 shown in FIG. 1B. It includes a substrate 210 and a die 230.

The substrate 210 is a package substrate that provides support and electrical interconnects for the die 230. The substrate 210 may be any suitable material such as silicon or any ceramic or polymeric substrate. The substrate 210 has substrate pads 220. The substrate pads 220 are placed on the top surface of the substrate 210 and provide contact points for interconnections with the die 230.

The die 230 is any semiconductor die. It may have a microelectronic device such as a microprocessor, a memory, an interface chip, an integrated circuit, etc. The die 230 is attached to the substrate 210 by a number of nanostructure bumps 250. The nanostructure bumps 250 provide interconnects with the substrate pads 220 on the substrate 210. The nanostructure bumps 250 may be fabricated using fabrication techniques described later. The die 230 may be attached to the substrate 210 using at least two techniques: soldering and thermo-sonic bonding. The attachment 260 may represent the solder paste or bump when the soldering technique is used. It may represent the metal layer of the same type as the metal used in the nanostructure bumps 250 when the thermo-sonic bonding technique is used. For example, the substrate 220 may be Cu and the nanowires in the nanostructure bump 2150 may be grown from Au. When thermo-sonic bonding is used, the substrate pads 220 may be coated with the attachment 260 as an Au layer so that reliable metal-to-metal bonding may be achieved.

Figure 2B:
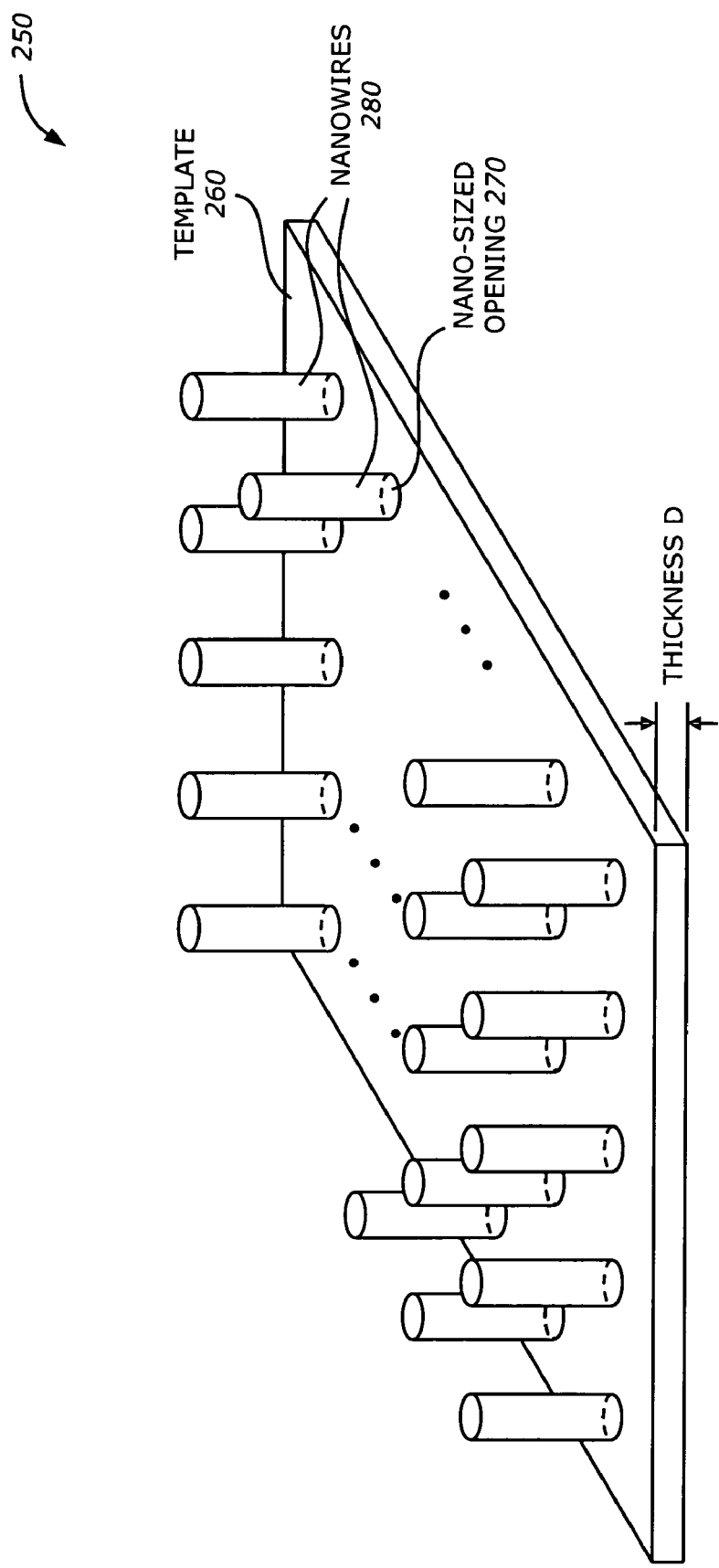
FIG. 2B is a diagram illustrating a nanostructure bump according to one embodiment of the invention.

FIG. 2B is a diagram illustrating the nanostructure bump 250 shown in FIG. 2A according to one embodiment of the invention. The nanostructure bump 250 includes a template 260 and a number of metallic nano-wires 280.

The template 260 has or defines nano-sized openings 270. The template 260 is disposed, deposited, or coated on a die. It may be an anodic aluminum oxide (AAO) template having the nano-sized openings 270 as an ordered array of pores, or a polycarbonate template having the nano-sized openings as holes etched from a polycarbonate film. It may have a thickness of approximately a few hundred nanometers (nm) such as ranging from 100 nm to 500 nm. The nano-sized openings may have sizes ranging from 5 nm to 300 nm.

The metallic nano-wires 280 are grown from a metal and extend from the nano-sized openings that correspond to interconnect contacts on the die. Essentially, the pores or holes are filled with a suitable metal (e.g., Au, Ag, or Cu) to form metallic nano-wires or rods defined by the template. This may be performed using electroplating or electroless process with AAO as a growth template.

Figure 3:
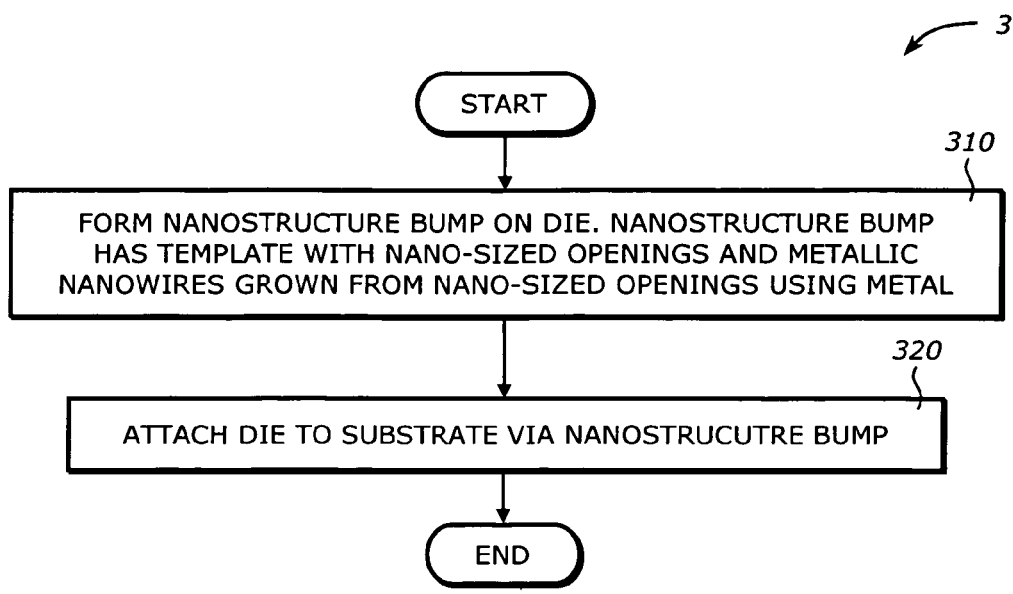
FIG. 3 is a flowchart illustrating a process to interconnect a package according to one embodiment of the invention.

FIG. 3 is a flowchart illustrating a process 300 to interconnect a package according to one embodiment of the invention.

Upon START, the process 300 forms a nanostructure bump on a die (Block 310). The nanostructure bump has a template defining, or having, nano-sized openings and metallic nano-wires grown from, or extending from, the nano-sized openings using a metal such as Au, Ag, or Cu. Then, the process 300 attaches the die to a substrate via the nanostructure bump (Block 320). The process 300 is then terminated.

Figure 4:
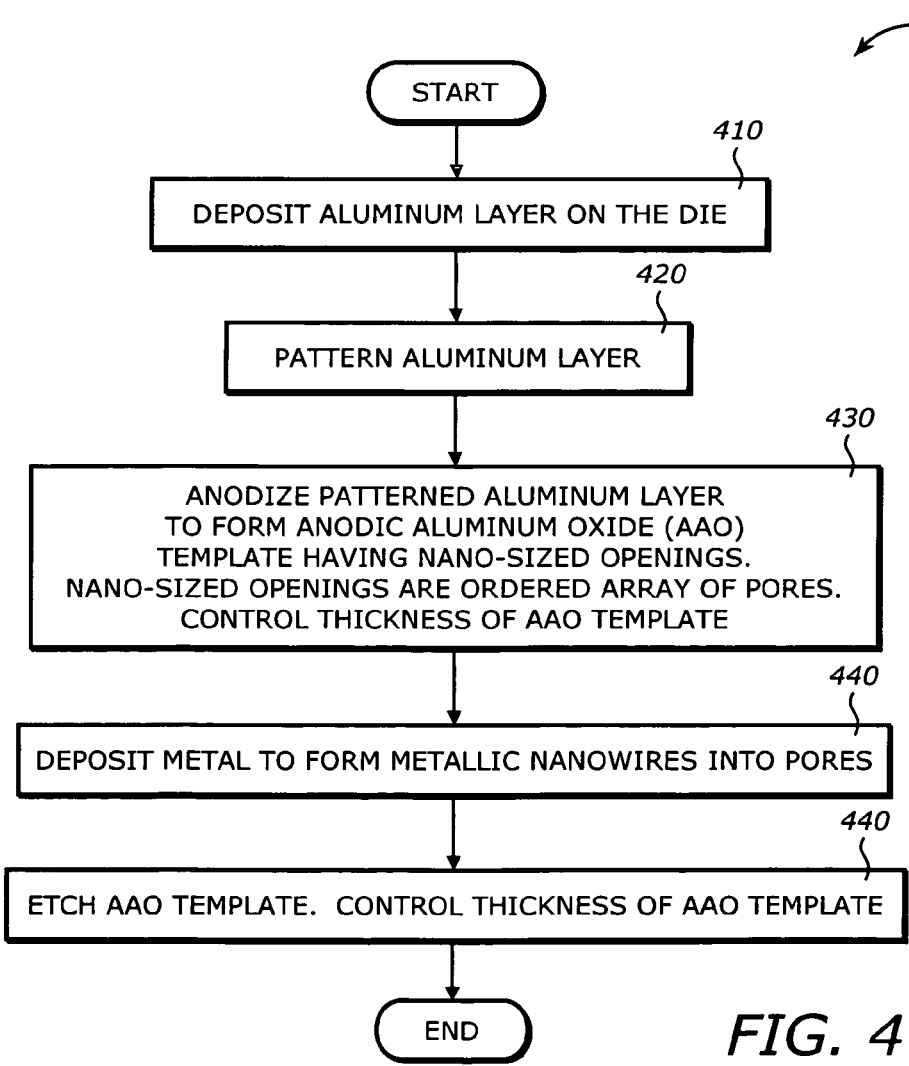
FIG. 4 is a flowchart illustrating a process to form a nanostructure bump using AAO template according to one embodiment of the invention.

FIG. 4 is a flowchart illustrating a process 310 shown in FIG. 3 to form a nanostructure bump using an AAO template according to one embodiment of the invention.

Upon START, the process 310 deposits an aluminum layer or film on the die (Block 410). The aluminum layer includes aluminum of high purity. The deposition of the aluminum layer may be performed by electron beam evaporation or by sputtering. Then, the process 310 patterns the aluminum layer for subsequent creation of ordered pores (Block 420). The patterning may be performed using a standard lithographic patterning process. Next, the process 310 anodizes the patterned aluminum layer to form an anodic aluminum oxide (AAO) template defining, or having, the nano-sized openings (Block 430). Under proper anodization conditions, aluminum oxidizes as a porous structure with aligned pores that have close-packed order at short range and with pore sizes that may be varied from approximately 5 nm to 30 nm. The anodization creates alumina with an ordered array of slender (e.g., with high aspect ratio) pores running perpendicular to the thickness of the aluminum layer. The nano-sized openings are the ordered array of pores. The anodization may be carried out either using 5% phosphoric acid at 80V or 0.3M oxalic acid at 40V. Both anodization processes may be carried out at around room temperature and may last for several hours. During anodization, the thickness of the AAO template may be controlled by adjusting the voltage, current, solvents, etc.

Then, the process 310 deposits the metal to form the metallic nano-wires into the pores (Block 440). The metal deposition may be carried out in an organic solution of dimethylsulfoxide (DMSO) with a metal chloride (e.g., $AuCl_x$) as an electrolyte, in a sealed glass chamber at approximately 130° C. under nitrogen gas for inert atmosphere. An alternating current (AC) voltage may be used at frequencies less than 1 KHz. The nano-wires are formed via metal diffusion and deposition into the AAO pores. The nano-wire growth rate is a function of the AC voltage, AC frequency, solution concentration as well as the geometrical features of the AAO pores. A typical growth rate is approximately 50 nm per minute.

Next, the process 310 etches the AAO template (Block 450). The etching may be partial and use hydrogen fluoride (HF). During etching, the thickness of the AAO template may be controlled. The thickness of the AAO template, therefore, may be controlled during the initial anodization or during the template etching. The template thickness may be controlled to a few hundred nanometers.

Figure 5:
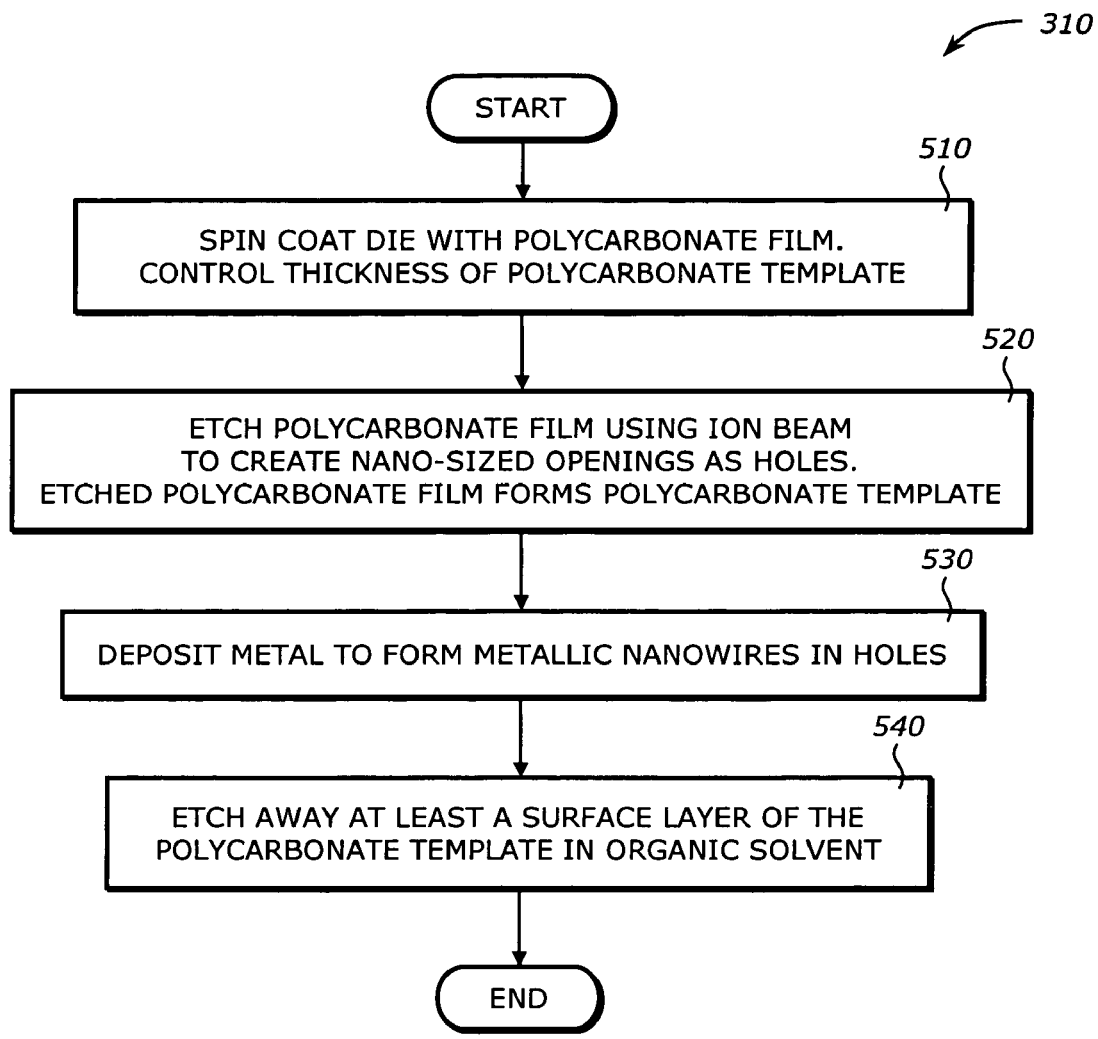
FIG. 5 is a flowchart illustrating a process to form a nanostructure bump using polycarbonate template according to one embodiment of the invention.

FIG. 5 is a flowchart illustrating a process 310 shown in FIG. 3 to form a nanostructure bump using polycarbonate template according to one embodiment of the invention.

Upon START, the process 310 spin coats the die with a polycarbonate film (Block 510). During spin coating, the thickness of the polycarbonate template may be controlled to a few hundred nanometers. Then, the process 310 etches the polycarbonate film using an ion beam to create the nano-sized openings as holes (Block 520). The holes may have sizes ranging approximately from 5 nm to 300 nm. The etching may be performed by rastering an ion beam over the polycarbonate film. The etched polycarbonate film forms a polycarbonate template.

Next, the process 310 deposits the metal to form the metallic nano-wires in the holes (Block 530). This may be performed by electro-deposition of metal (e.g., Au) from the aqueous solution of Au chloride or sulfate as an electrolyte. Then, the process 310 etches away at least a surface layer of the polycarbonate template in an organic solvent such as dichloromethane (Block 540). The process 310 is then terminated.

Figure 6:
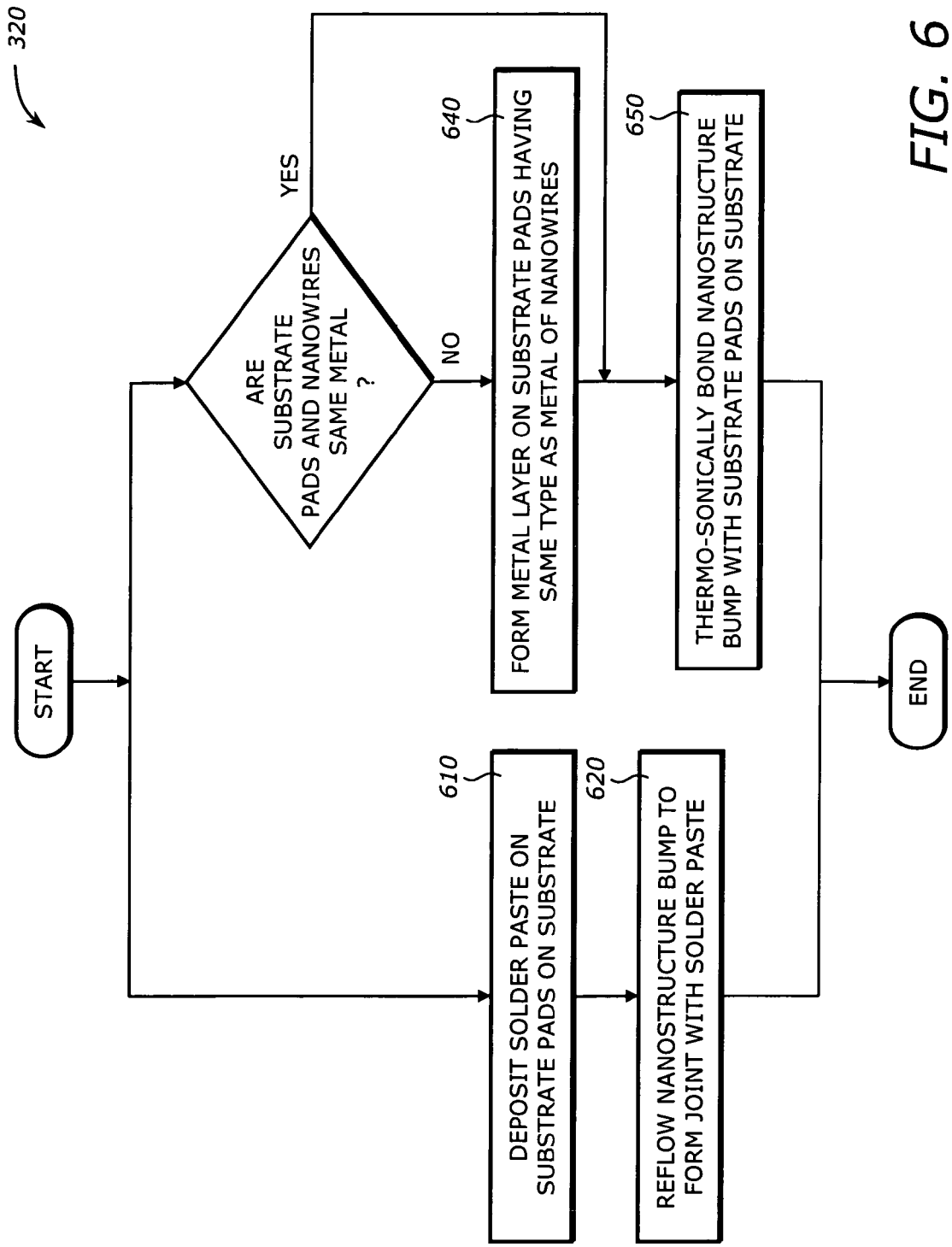
FIG. 6 is a flowchart illustrating a process to attach a die to a substrate using the nanostructure bump according to one embodiment of the invention.

FIG. 6 is a flowchart illustrating a process 320 shown in FIG. 3 to attach a die to a substrate using the nanostructure bump according to one embodiment of the invention.

Upon START, the process 320 selects whether soldering or thermo-sonic bonding technique is used. If the soldering technique is used, the process 320 deposits solder paste on substrate pads on the substrate (Block 610). This may be performed using s standard solder pasting process. Then, the die is positioned or aligned with the substrate using any standard technique such as pick-and-place. Then, the process 320 reflows the nanostructure bump to form joint with the solder paste (Block 620). For nanostructure bumps with Au or Ag, a Ni or Cu layer may be deposited or coated on top of the exposed Au or Ag for more reliable wettable surface because Au and Ag may have high dissolution rate in molten solder. This may be performed by physical vapor deposition (PVD) or electroplating. For nanostructure bumps with Cu, such coating may not be necessary. The process 320 is then terminated.

If the thermo-sonic bonding technique is used, the process 320 first determines if the substrate pads and the nano-wires in the nanostructure bumps have the same type of metal. If so, the process 320 proceeds directly to Block 650. Otherwise, the process 320 forms a metal layer on the substrate pads having same type as the metal of the nano-wires (Block 640). For example, Au or Ag layer may be formed on top of the Cu pads in the substrate pads for Au—Au or Ag—Ag metal-to-metal bond. Then, the process 320 thermo-sonically bonds the nanostructure bump with substrate pads on the substrate (Block 650). By applying heat and ultrasonic vibration, the metal-to-metal bonding may be achieved through plastic deformation and solid-state diffusion and solid-state welding. Conventional wire bumping equipment or process may be used. The process 320 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    forming a nanostructure bump on a die, the nanostructure bump having a template defining nano-sized openings and metallic nano-wires grown from the nano-sized openings; and
    attaching the die to a substrate via the nanostructure bump.

2. The method of claim 1 wherein forming the nanostructure bump comprises:
    depositing an aluminum layer on the die;
    patterning the aluminum layer;
    anodizing the patterned aluminum layer to form an anodic aluminum oxide (AAO) template having the nano-sized openings being an ordered array of pores;
    depositing a metal to form the metallic nano-wires into the pores; and
    etching the AAO template.

3. The method of claim 2 wherein anodizing comprises:
    controlling thickness of the AAO template.

4. The method of claim 2 wherein etching comprises:
    controlling thickness of the AAO template.

5. The method of claim 1 wherein forming the nanostructure bump comprises:
    spin coating the die with a polycarbonate film;
    etching the polycarbonate film using an ion beam to create the nano-sized openings being holes, the etched polycarbonate film forming a polycarbonate template;
    depositing a metal to form the metallic nano-wires in the holes; and
    etching away at least a surface layer of the polycarbonate template in an organic solvent.

6. The method of claim 5 wherein spin coating the die comprises:
    controlling thickness of the polycarbonate template.

7. A method comprising:
    forming a nanostructure bump on a die, the nanostructure bump having a template defining nano-sized openings and metallic nano-wires grown from the nano-sized openings; and
    attaching the die to a substrate via the nanostructure bump;
    wherein attaching the die to the substrate comprises:
        depositing solder paste on substrate pads on the substrate; and
        reflowing the nanostructure bump to form joints with the solder paste.

8. A method comprising:
    forming a nanostructure bump on a die, the nanostructure bump having a template defining nano-sized openings and metallic nano-wires grown from the nano-sized openings; and
    attaching the die to a substrate via the nanostructure bump;
    wherein attaching the die to the substrate comprises:
        thermo-sonically bonding the nanostructure bump with substrate pads on the substrate.

9. The method of claim 8 wherein attaching the die to the substrate further comprises:
    forming a metal layer on the substrate pads having same type as a metal of the nano-wires before thermo-sonically bonding the nanostructure bump.

* * * * *